(12) United States Patent
Keller

(10) Patent No.: US 10,820,441 B1
(45) Date of Patent: Oct. 27, 2020

(54) INSTALLATION TOOL FOR USE WITH A DATA CENTER RACK AND METHOD OF USE

(71) Applicant: Glenn Keller, Desoto, TX (US)

(72) Inventor: Glenn Keller, Desoto, TX (US)

( * ) Notice: Subject to any disclaimer, the term of this patent is extended or adjusted under 35 U.S.C. 154(b) by 106 days.

(21) Appl. No.: 15/986,946

(22) Filed: May 23, 2018

Related U.S. Application Data

(60) Provisional application No. 62/509,997, filed on May 23, 2017.

(51) Int. Cl.
*H05K 7/14* (2006.01)
*H05K 7/16* (2006.01)

(52) U.S. Cl.
CPC ............. *H05K 7/1417* (2013.01); *H05K 7/14* (2013.01); *H05K 7/1487* (2013.01); *H05K 7/1489* (2013.01); *H05K 7/16* (2013.01)

(58) Field of Classification Search
CPC .. H05K 7/1417; H05K 7/1487; H05K 7/1489; H05K 7/16; H05K 7/14
See application file for complete search history.

(56) References Cited

U.S. PATENT DOCUMENTS

| | | | | |
|---|---|---|---|---|
| 7,787,253 | B1 * | 8/2010 | Davey | H05K 7/1489 312/223.1 |
| 7,866,488 | B2 * | 1/2011 | Mimlitch, III | H05K 7/1489 211/26 |
| 2005/0225217 | A1 * | 10/2005 | Nay | A47B 21/0314 312/208.1 |
| 2006/0180555 | A1 * | 8/2006 | Shih | H05K 7/1489 211/26 |
| 2008/0135503 | A1 * | 6/2008 | Hidaka | H05K 7/1448 211/26 |
| 2010/0326938 | A1 * | 12/2010 | Zhu | A47B 31/04 211/149 |

* cited by examiner

*Primary Examiner* — Nidhi Thaker
(74) *Attorney, Agent, or Firm* — Eldredge Law Firm

(57) ABSTRACT

An installation tool for aiding in securing a device within a data center rack, the installation tool includes a plate having a shape appropriate to fit within an interior of the data center rack; a first mount extending from a first front corner of the plate, the first mount having a first peg; and a second mount extending from a second front corner of the plate, the second mount having a second peg; the first and second peg are to secure the first mount and the second mount to a frame of the data center rack; and the plate provides a surface to hold the device within the data center rack for the device to be secured to the data center rack.

4 Claims, 9 Drawing Sheets

INSTALLATION TOOL FOR USE WITH A DATA CENTER RACK AND METHOD OF USE

BACKGROUND

1. Field of the Invention

The present invention relates generally to data center rack systems, and more specifically, to an installation tool for use with a data center rack for aiding in installing one or more devices into the rack.

2. Description of Related Art

Data center rack systems are well known in the art and are effective means to store and organize a plurality of electronic devices. For example, FIG. 1 depicts a conventional data center rack system 101 having a rack 103 with a plurality of permanently installed shelves 105, 107 holding one or more devices 109, 111, 113. During use, shelves 105, 107 are installed to hold the one or more devices.

One of the problems commonly associated with system 101 is space. For example, shelves 105, 107 take up space and therefore limit the capacity of data rack 103.

Accordingly, although great strides have been made in the area of data center rack systems, many shortcomings remain.

DESCRIPTION OF THE DRAWINGS

The novel features believed characteristic of the embodiments of the present application are set forth in the appended claims. However, the embodiments themselves, as well as a preferred mode of use, and further objectives and advantages thereof, will best be understood by reference to the following detailed description when read in conjunction with the accompanying drawings, wherein:

Figure 1:
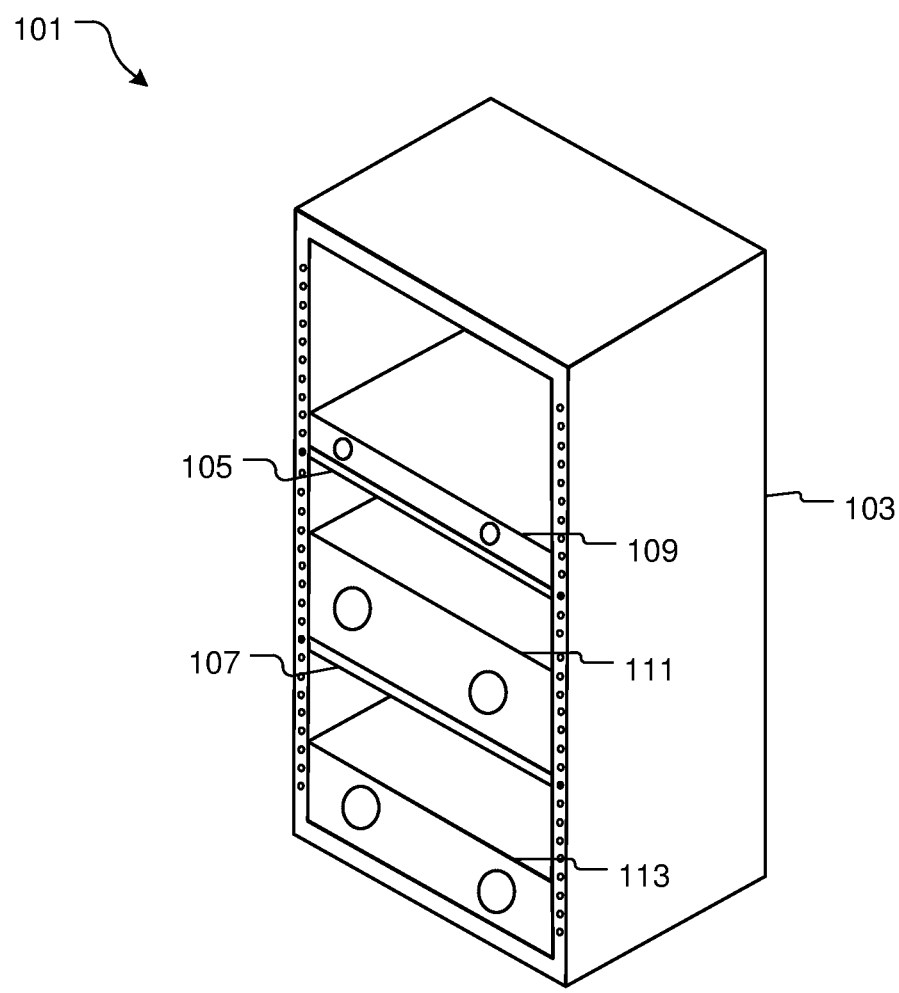
FIG. 1 is an oblique view of a common data center rack system.

While the system and method of use of the present application is susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DETAILED DESCRIPTION OF THE PREFERRED EMBODIMENT

Illustrative embodiments of the system and method of use of the present application are provided below. It will of course be appreciated that in the development of any actual embodiment, numerous implementation-specific decisions will be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of use in accordance with the present application overcomes one or more of the above-discussed problems commonly associated with conventional data center rack systems. Specifically, the present invention provides a tool to aid in installing one or more devices within a data center rack without the use of shelving. These and other unique features of the system and method of use are discussed below and illustrated in the accompanying drawings.

The system and method of use will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

The preferred embodiment herein described is not intended to be exhaustive or to limit the invention to the precise form disclosed. It is chosen and described to explain the principles of the invention and its application and practical use to enable others skilled in the art to follow its teachings.

Figure 2A:
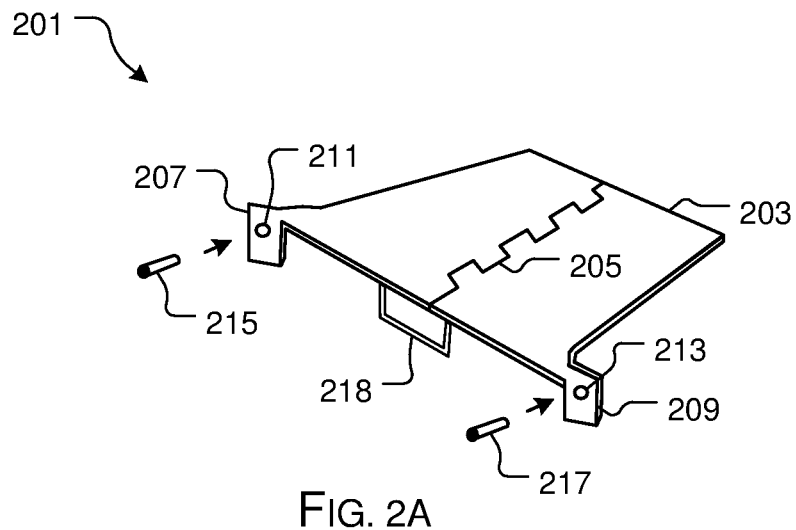
FIGS. 2A and 2B are oblique views of an installation tool in accordance with a preferred embodiment of the present application.
Figure 2B:
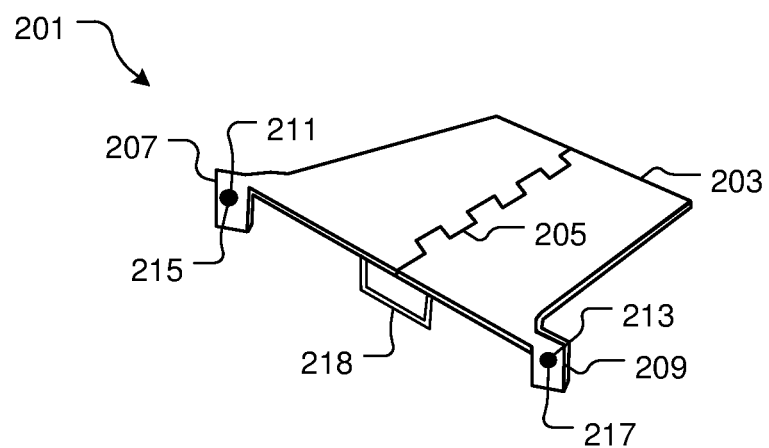

Referring now to the drawings wherein like reference characters identify corresponding or similar elements throughout the several views, FIGS. 2A and 2B depict oblique views of an installation tool 201 in accordance with a preferred embodiment of the present application. It will be appreciated that tool 201 overcomes one or more of the above-listed problems commonly associated with conventional data center rack systems.

In the contemplated embodiment, tool 201 includes a plate 203 having an appropriate shape to be inserted within an interior of a data rack. It should be appreciated that plate 203 can vary in size based on variously sized data racks. Plate 203 can further include one or more folding mechanisms 205, thereby providing flexibility to plate 203. In the preferred embodiment, tool 201 includes two mounts 207, 209 extending from the front of plate 203, each mount having a hole 211, 213 for receiving a peg 215, 217. Tool 201 can further include one or more handles 218 for aiding in use.

Figure 3A:
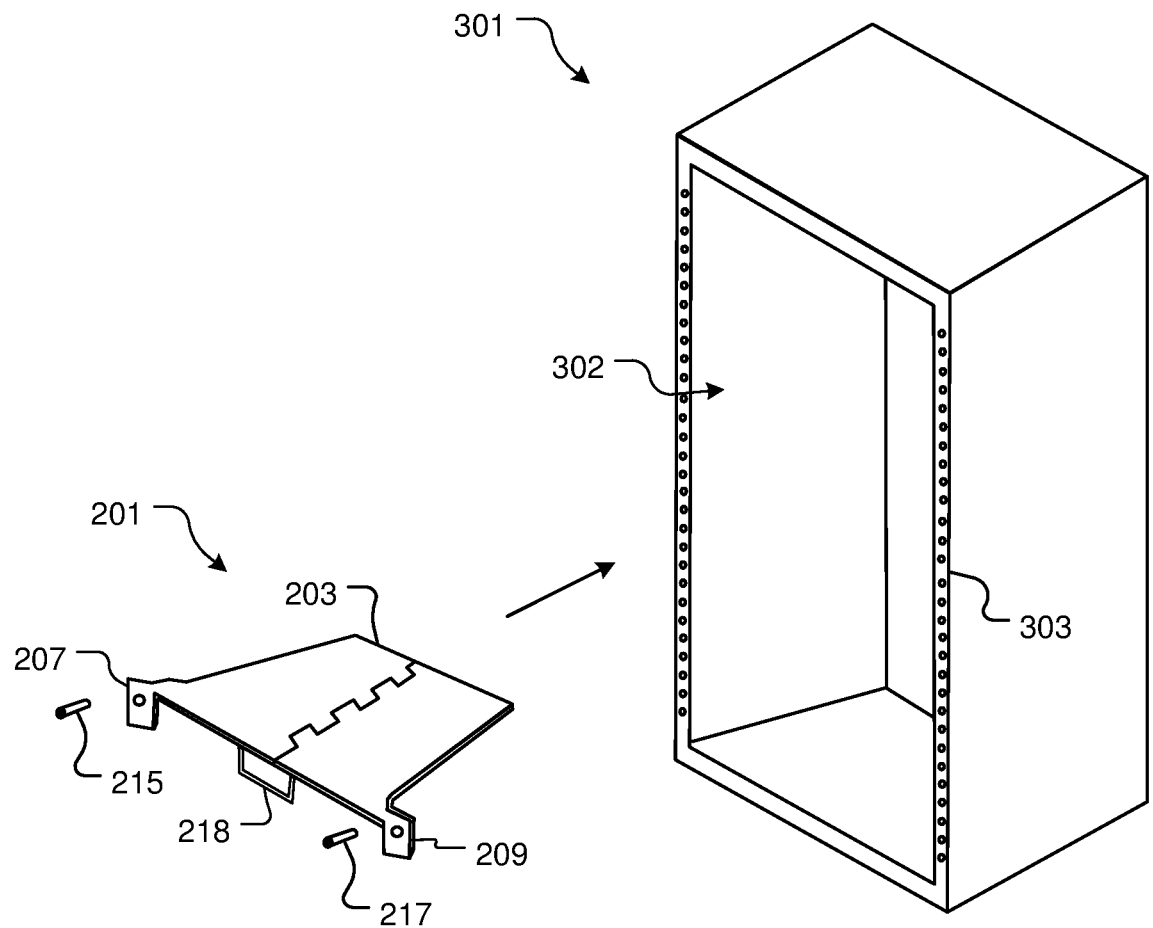
FIGS. 3A-3D are oblique views of various steps of a data center rack installation system with the installation tool of FIGS. 2A and 2B.
Figure 3B:
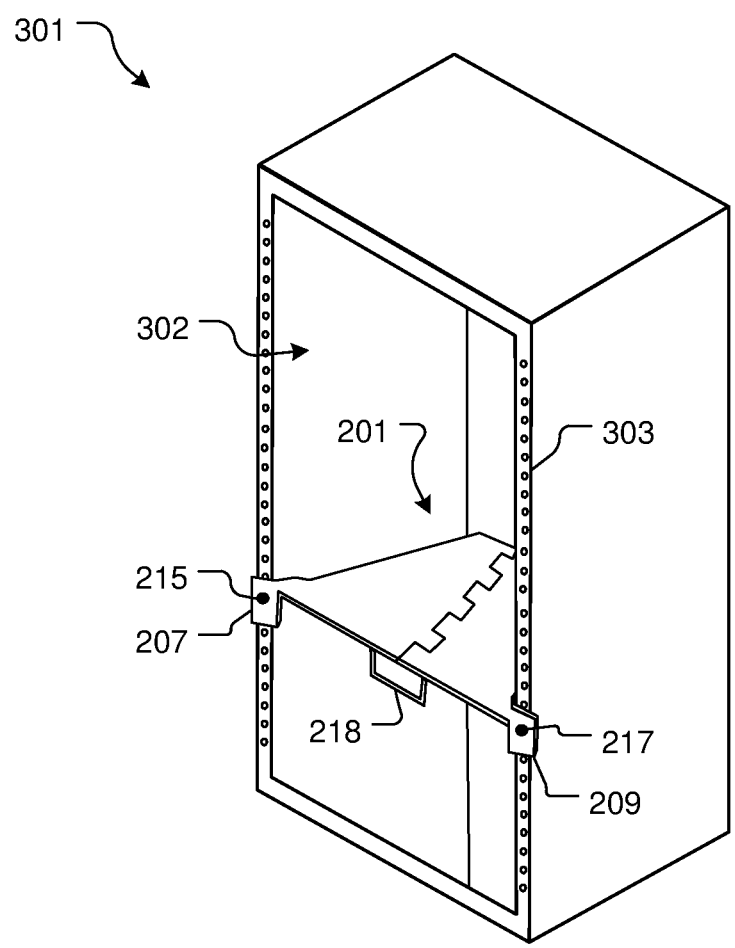
Figure 3C:
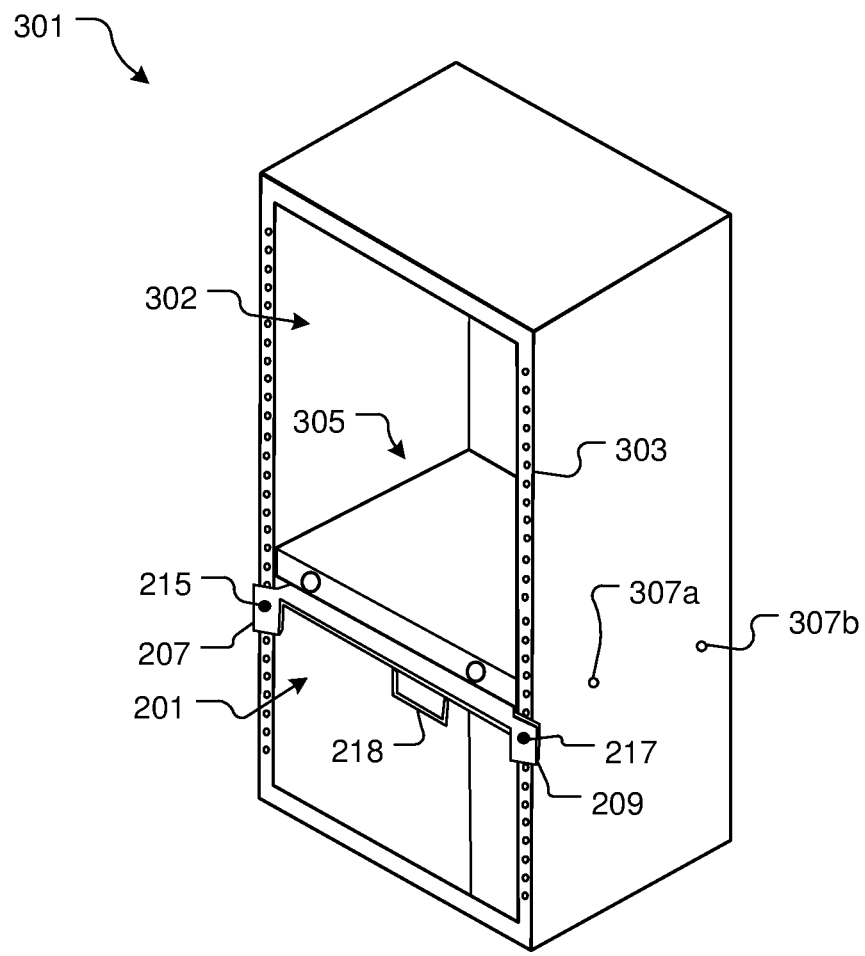
Figure 3D:
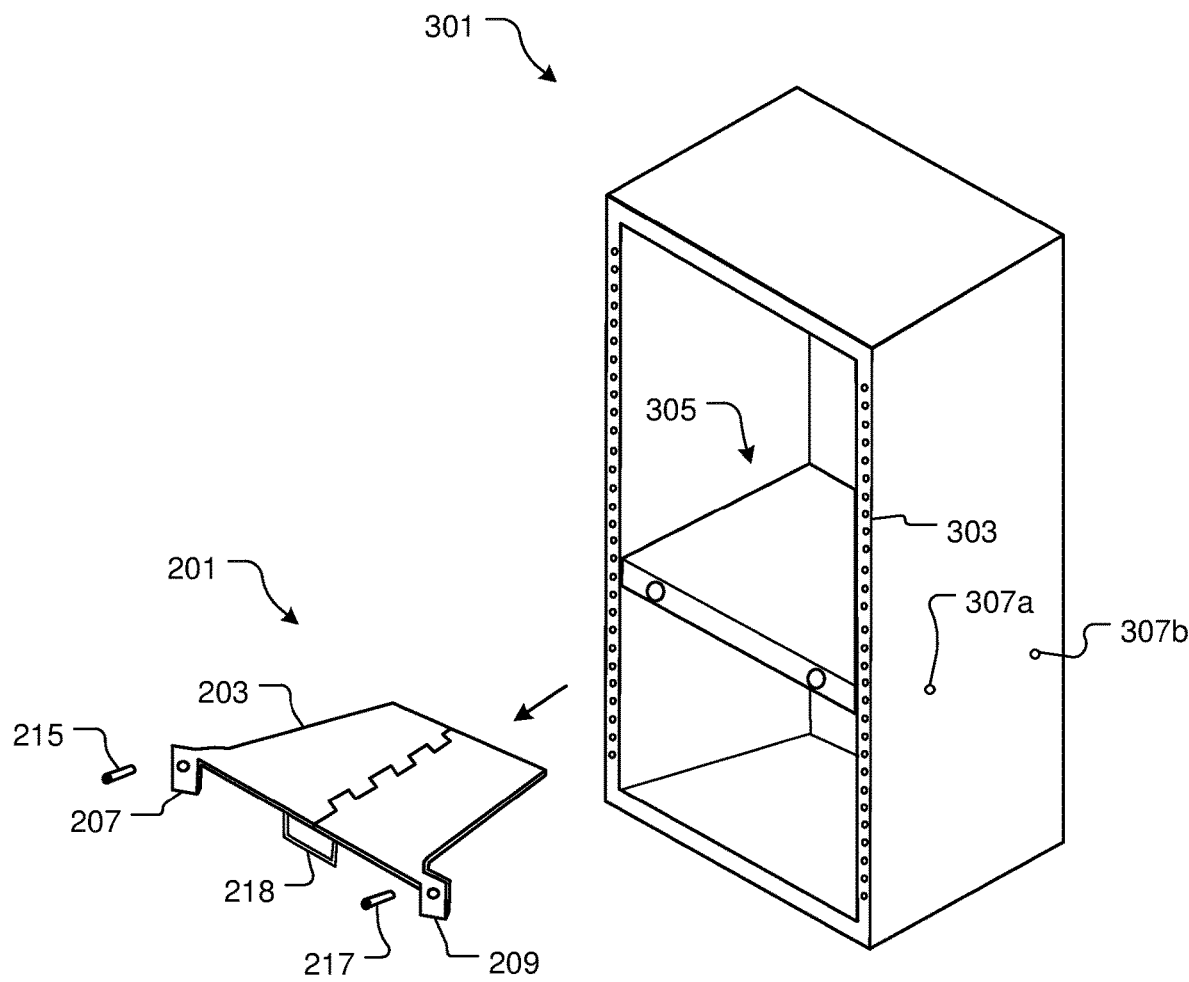

As shown in FIGS. 3A-3D, tool 201 is configured to be inserted into a data center rack 301 wherein plate 203 is positioned within an interior area 302 of rack 301 and quickly secured in place via pegs 215, 217 and holes associated with a frame 303 of rack 301. In the preferred embodiment, mounts 207, 209 are positioned on the outside of frame 303, thereby providing easy access to pegs 215, 217. After installation tool 201 is secured in place, a device 305 can be placed on top of tool 201 and secured within rack 301 via one or more screws 307a, 307b or other securing devices, as shown in FIG. 3C. After securing device 305 in rack 301, tool 201 is easily removed by removing pegs 215, 217 and then removing tool 201 from rack 301, as shown in FIG. 3D. Tool 201 can then be used to install additional devices within rack 301.

It should be appreciated that one of the unique features believed characteristic of the present application is the adaptation of mounts 207, 209 to be secured to rack 301 via pegs 215, 217, and then easily removed after a device is installed. It should be appreciated that this feature allows for many devices to be quickly installed into a rack, while space is saved through the elimination of multiple shelves within the rack.

Figure 4A:
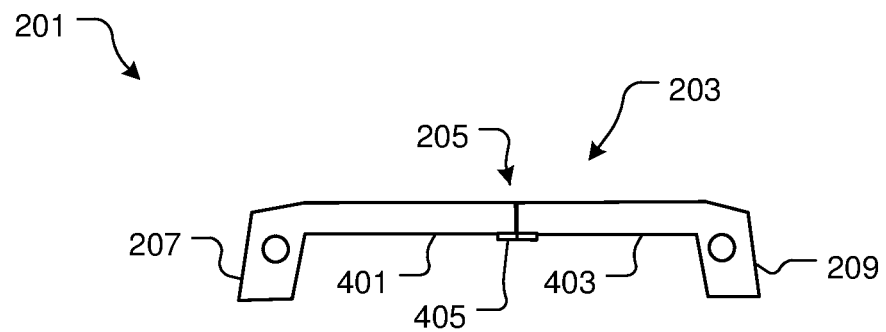
FIGS. 4A and 4B are front views of the installation tool of FIGS. 2A and 2B.
Figure 4B:
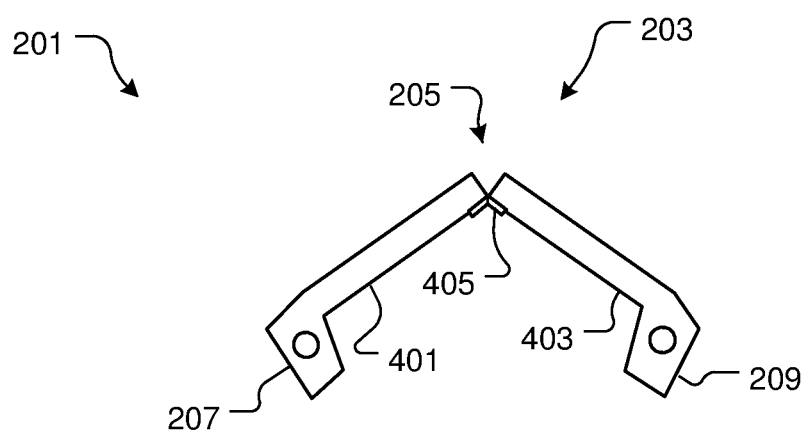

In FIGS. 4A and 4B, one contemplated folding mechanism 205 of tool 201 is depicted. It is contemplated that plate 203 can include a first half 401 secured to a second half 403 by one or more hinges 405, thereby allowing for plate 203 to fold. It should be understood that hinges can be placed inside a seam between halves 403, 405, or alternatively be placed on the top of or on the bottom of plate 203. It should further be understood that other means could be used to provide a folding mechanism of plate 203.

Figure 5A:
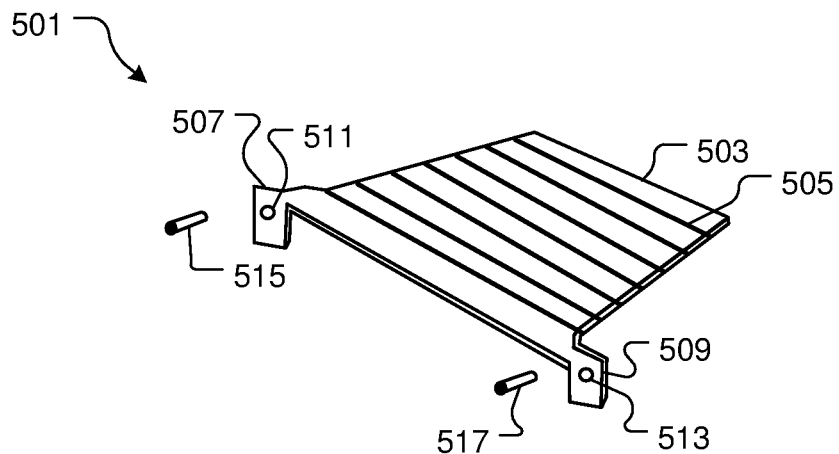
FIGS. 5A and 5B are oblique views of an alternative embodiment of an installation tool in accordance with the present application.
Figure 5B:
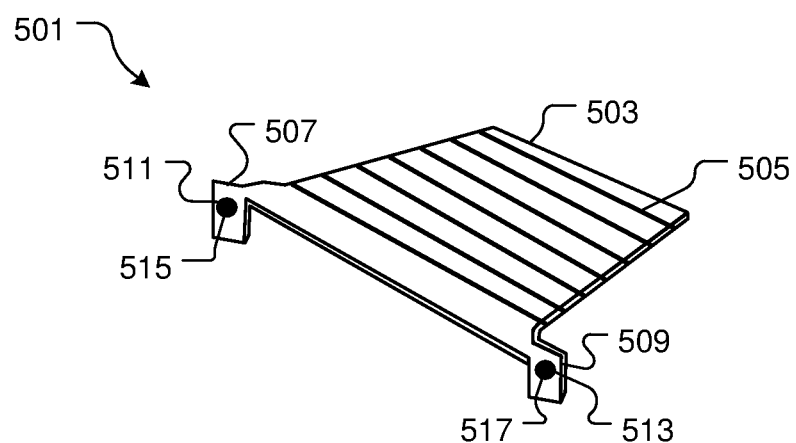

In FIGS. 5A and 5B, an alternative embodiment of an installation tool 501 is shown. Tool 501 can include the features discussed above and associated with tool 201. Tool 501 includes a plate 503 composed of a plurality of wires 505, thereby creating a substantially open surface. It should be appreciated that this feature provides for a lighter weight tool, for use during installation. Tool 501 also includes two mounts 507, 509 with holes 511, 513 for receiving pegs 515, 517.

Figure 6:
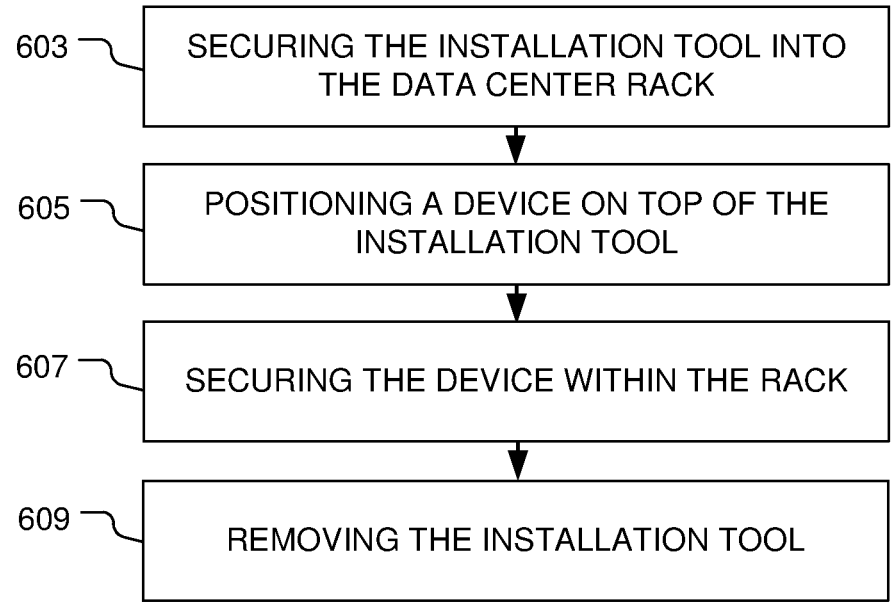
FIG. 6 is a flowchart of the method of use of FIGS. 2A and 2B.

In FIG. 6, a flowchart 601 depicts the method of use associated with tool 201 and tool 501. During use, the installation tool is secured within the data center rack, as shown with box 603. A device is placed on top of the plate and secured within the rack with a securing device, such as a bolt or screw, as shown with boxes 605, 607. The installation tool is then removed and can be re-used to install another device, as shown with box 609.

The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered or modified, and all such variations are considered within the scope and spirit of the application. Accordingly, the protection sought herein is as set forth in the description. Although the present embodiments are shown above, they are not limited to just these embodiments, but are amenable to various changes and modifications without departing from the spirit thereof.

What is claimed is:

1. An installation tool for aiding in securing a device within a data center rack, the installation tool comprising:
   a plate having a shape appropriate to fit within an interior of the data center rack, the plate having:
      a first section hingedly attached to a second section via a hinge;
      wherein both the first section and the second section are configured to fit within the interior of the data center rack; and
      wherein the device sits on both the first section and the second section during installation;
   a first mount extending from a first front corner of the plate, the first mount having a first peg; and
   a second mount extending from a second front corner of the plate, the second mount having a second peg;
   wherein the first and second peg are configured to secure the first mount and the second mount to a frame of the data center rack; and
   wherein the plate provides a surface to hold the device within the data center rack for the device to be secured to the data center rack.

2. The installation tool of claim 1, wherein the plate further comprises:
   a plurality of wires.

3. The installation tool of claim 1, further comprising:
   a handle.

4. A method of installing one or more devices into a data center rack, the method comprising:
   providing the installation tool of claim 1;
   securing the installation tool into the data center rack, wherein the plate is positioned within an interior area of the data center rack and wherein the first mount and second mount are secured to a frame of the data center rack;
   placing a device to be installed on the first section and the second section of the plate;
   securing the device in place within an interior of the data center rack; and
   removing the installation tool from the data center rack.

* * * * *